United States Patent
Choi et al.

(10) Patent No.: US 8,952,531 B2
(45) Date of Patent: Feb. 10, 2015

(54) PACKAGING METHOD USING SOLDER COATING BALL AND PACKAGE HAVING SOLDER PATTERN INCLUDING METAL PATTERN

(71) Applicant: Samsung Electro-Mechanics Co., Ltd., Suwon (KR)

(72) Inventors: Jin Won Choi, Suwon (KR); Yon Ho You, Suwon (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 13/845,108

(22) Filed: Mar. 18, 2013

(65) Prior Publication Data

US 2014/0035130 A1 Feb. 6, 2014

(30) Foreign Application Priority Data

Aug. 6, 2012 (KR) .......... 10-2012-0085823

(51) Int. Cl.
*H01L 23/498* (2006.01)
*H01L 21/768* (2006.01)
*H01L 23/00* (2006.01)

(52) U.S. Cl.
CPC .... *H01L 21/76895* (2013.01); *H01L 23/49816* (2013.01); *H01L 23/49894* (2013.01); *H01L 24/16* (2013.01); *H01L 2224/16225* (2013.01); *H01L 24/81* (2013.01); *H01L 2224/13082* (2013.01); *H01L 2224/131* (2013.01); *H01L 2224/16238* (2013.01); *H01L 2224/81193* (2013.01); *H01L 2224/81424* (2013.01); *H01L 2224/81439* (2013.01); *H01L 2224/81444* (2013.01); *H01L 2224/81447* (2013.01); *H01L 2224/81815* (2013.01)
USPC .............. 257/737; 257/E23.02; 257/E23.004; 257/738; 257/778; 257/789; 257/780

(58) Field of Classification Search
USPC ......... 257/737, 738, 778, 779, 783, 788, 789, 257/E23.021, E23.004, 780
See application file for complete search history.

(56) References Cited

U.S. PATENT DOCUMENTS

| | | | | |
|---|---|---|---|---|
| 8,581,403 | B2* | 11/2013 | Ouchi | 257/738 |
| 2004/0012097 | A1* | 1/2004 | Chang et al. | 257/778 |
| 2007/0290306 | A1* | 12/2007 | Muramatsu et al. | 257/678 |
| 2008/0150159 | A1* | 6/2008 | Aberin et al. | 257/778 |
| 2009/0065936 | A1* | 3/2009 | Ong et al. | 257/738 |
| 2009/0294162 | A1* | 12/2009 | Jeong et al. | 174/260 |
| 2010/0252304 | A1* | 10/2010 | Muramatsu et al. | 174/251 |
| 2011/0156264 | A1* | 6/2011 | Machida | 257/773 |
| 2011/0195543 | A1* | 8/2011 | Jadhav et al. | 438/106 |

(Continued)

FOREIGN PATENT DOCUMENTS

KR 10-2008-0014143 A 2/2008
WO WO 2005/088706 A1 * 9/2005

*Primary Examiner* — Alexander Oscar Williams
(74) *Attorney, Agent, or Firm* — Ladas & Parry, LLP

(57) ABSTRACT

A packaging method comprises steps of forming a plurality of pads and another circuit pattern on a substrate, forming a second dry film pattern including opening exposing the pad, mounting a solder coating ball in the opening of the second dry film pattern, performing a reflow process on the solder coating ball in order to allow the solder coating ball to have a modified pattern, delaminating the second dry film pattern, and forming a solder pattern including the modified pattern of the solder coating ball in a solder to mount a chip on the substrate using the solder pattern.

4 Claims, 5 Drawing Sheets

(56) References Cited

U.S. PATENT DOCUMENTS

| | | | |
|---|---|---|---|
| 2011/0304058 A1* | 12/2011 | Pendse | 257/778 |
| 2011/0316170 A1* | 12/2011 | Muramatsu et al. | 257/774 |
| 2012/0312584 A1* | 12/2012 | Chen et al. | 174/251 |
| 2012/0313240 A1* | 12/2012 | Cheng et al. | 257/737 |

* cited by examiner

PACKAGING METHOD USING SOLDER COATING BALL AND PACKAGE HAVING SOLDER PATTERN INCLUDING METAL PATTERN

CROSS REFERENCE TO RELATED APPLICATION

This application claims the benefit of Korean Patent Application No. 10-2012-0085823, filed on Aug. 6, 2012, entitled "Packaging Method Using Solder Coating-Ball and Package Thereby", which is hereby incorporated by reference in its entirety into this application.

BACKGROUND OF THE INVENTION

1. Technical Field

The present invention relates to a packaging method using a solder coating-ball and a package manufactured thereby.

2. Description of the Related Art

According to the prior art, a flip chip scheme in which a solder bump is formed on a printed circuit board (PCB) and then, a device is mounted thereon to thereby package them has been increasingly used.

In particular, in the case of a central processing unit (CPU) and a graphic operation device operating large capacity data at a high speed, a change from a scheme connecting between a substrate and a device using a gold (Au) wire according to the prior art to the flip chip scheme in which the substrate and the device are connected by the solder bump so as to improve connection resistance has been rapidly increased.

Methods forming the solder bump as described above may be divided into a scheme forming the solder bump by printing a solder paste on the substrate and then reflowing the solder paste, a scheme forming the solder ball by mounting a fine solder ball on the substrate, and a method forming the solder bump by injecting a melted solder into the substrate directly or using a mask. The solder bump formed on the substrate as described above is melted so as to connect to a copper (Cu) pad or a solder bump formed on a chip, thereby coupling between metals.

The methods forming the above-mentioned solder bump may include a ball placing scheme in which the same size openings having the same size are formed on the mask and then the solder ball is squeegeed using a squeegee, such that the solder ball is mounted on input/output pad of the substrate through the mask openings, or a scheme in which a vacuum hole having the same pattern as a substrate pattern is formed at a jig and then the solder ball is picked-up at vacuum so as to be mounted on the substrate, as described in Korea Patent Laid-Open Publication No. 2008-0014143 (laid-open published on Feb. 13, 2008).

However, as a pitch of the input/output pad of the substrate gradually becomes fine, a technology forming the solder bump on the input/output pad of the substrate using the solder ball or a paste according to the prior art has been gradually changed to a scheme forming the bump made of copper (Cu) using a plating and lithography technologies.

The packaging method using the bump made of copper (Cu) using the above-mentioned plating and lithography technologies has a problem in that an interface between the solder and an electroless Cu is separated from each other due to low interface stability, such that processing stability is degraded.

In addition, a plating thickness deviation occurring at the time of plating copper (Cu) leads to a height deviation between the solder and the copper (Cu) bump, such that connection reliability in the packaged chip is deteriorated.

SUMMARY OF THE INVENTION

The present invention has been made in an effort to provide a packaging method improving connection reliability using a solder coating ball so as to solve the problems as mentioned above.

Further, the present invention has been made in an effort to provide a package manufactured by a packaging method using a solder coating ball so as to solve the problems as mentioned above.

According to a preferred embodiment of the present invention, there is provided a packaging method including: (A) forming a plurality of pads and another circuit pattern on a substrate; (B) forming a second dry film pattern including opening exposing the pad; (C) mounting a solder coating ball in the opening of the second dry film pattern; (D) performing a reflow process on the solder coating ball in order to allow the solder coating ball to have a modified pattern; (E) delaminating the second dry film pattern; and (F) forming a solder pattern including the modified pattern of the solder coating ball in a solder to mount a chip on the substrate using the solder pattern.

Step (A) may include: (A-1) forming a first dry film pattern having openings corresponding to the pad and another circuit pattern; (A-2) filling the first dry film pattern with copper; (A-3) delaminating the first dry film pattern; and (A-4) forming a solder resist (SR) pattern enclosing a region of the pad and burying another circuit pattern.

Step (A-2) may be performed by any one of a chemical vapor deposition (CVD) method, a physical vapor deposition (PVD) method, a subtractive method, an additive method using an electroless copper plating or electrolytic copper plating, a semi-additive process (SAP), and a modified semi-additive process (MSAP).

Step (B) may include: (B-1) laminating a dry film in an uncured state on the substrate including the pad and another circuit pattern using a laminate; and (B-2) performing a patterning process on the laminated dry film.

In step (D), the solder coating ball may be formed of a metal ball made of a conductive metal material and a solder coating film formed on an outer surface of the metal ball, wherein the solder coating film is melted and accumulated according to the reflow process to be adhered to the pad.

The solder coating film may be provided by plating an outer surface of the metal ball with the solder by an electroplating method.

According to another preferred embodiment of the present invention, there is provided a package including: a plurality of pads formed on a substrate; a solder resist (SR) pattern enclosing a region of the pad and burying another circuit pattern; a solder pattern including a metal pattern therein using a solder and formed on an upper surface of each of the pads; and a chip mounted on the substrate through the solder pattern.

The solder pattern may include a metal pattern made of a conductive metal material in the solder.

The chip may be formed at the same height from an upper surface of the substrate.

The package may further include a post bump between the chip and the solder pattern.

According to another preferred embodiment of the present invention, there is provided a packaging method including: (A) forming a plurality of pads and another circuit pattern on a substrate; (B) forming a second dry film pattern including an opening exposing the pad; (C) mounting a solder coating ball in the opening of the second dry film pattern; (D) performing a reflow process on the solder coating ball in order to allow the solder coating ball to have a modified pattern; (E) forming a solder pattern by filling and press-fitting the opening with a solder; (F) delaminating the second dry film pattern; and (G) mounting a chip on the substrate using the solder pattern.

In step (E), the solder may be filled and press-fitted into the opening using a solder injector.

The solder injector may include: a storing part storing the solder supplied from an outside; a discharging hole connected to the storing part in the form of a pipe to discharge the solder; a heating part enclosing and heating the discharging hole; and a press-fitting part allowing a melted solder discharged from the discharging hole to flow a surface of the press-fitting part to be injected, wherein the solder is filled and press-fitted into the openings using the press-fitting part.

The storing part may be connected to a pressurization pump or a piston to discharge the solder into the discharging hole.

The press-fitting part may be formed of an elastic material to squeeze along with an upper surface of the second dry film provided with the openings.

In step (G), the chip may be mounted on the substrate by correspondingly adhering a post bump of the chip to the solder pattern.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
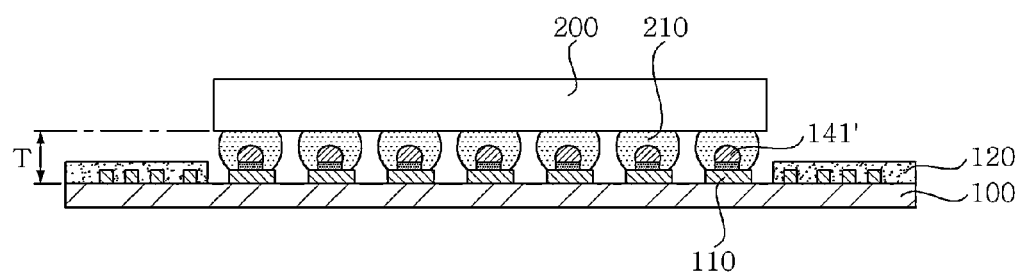
FIG. 1 is a cross-sectional view showing a package according to a preferred embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings. FIG. 1 is a cross-sectional view showing a package according to a preferred embodiment of the present invention.

A package according to a preferred embodiment of the present invention includes a plurality of pads 110 formed on a substrate 100, solder resist patterns (SR patterns) 120 enclosing the pad 110 and burying another circuit pattern on the substrate 100, solder patterns 210 formed to include a solder on each of the pads 110, and a chip 200 connected to the pad 110 on the substrate 100 through the solder pattern 210 to be mounted thereon.

The SR pattern 120 encloses a pad 110 region in which the chip 200 is mounted on the substrate 100 using the solder resist and buries a plurality of circuits formed in a region except for the pad 110 region.

The solder pattern 210 is implemented as a form in which a conductive metal pattern 141' is included in the solder and is formed between the pad 110 on the substrate 100 and the chip 200 to electrically connect therebetween.

Specifically, the conductive metal pattern 141', which is formed to support the form of the solder pattern 210, is formed, for example, of a pattern in which a ball shape made of conductive metal materials such as copper, gold, silver, aluminum, or the like, is modified in a reflow process.

Since each of the solder patterns 210 as described above has the same volume and is formed between the pad 110 and the chip 200, the chip 200 is packaged while having the same mounted height T from an upper surface of the substrate 100.

Therefore, according to the package according to the preferred embodiment of the present invention, the chip 200 is packaged while having the same mounted height (T) from the upper surface of the substrate 100, thereby making it possible to improve connection reliability between the chip 200 and the pad 110.

Hereinafter, a packaging method of a package according to a preferred embodiment of the present invention will be described with reference to FIGS. 2A to 2F. FIGS. 2A to 2F are cross-sectional views sequentially showing the process of a packaging method of a package according to a preferred embodiment of the present invention.

Figure 2A:
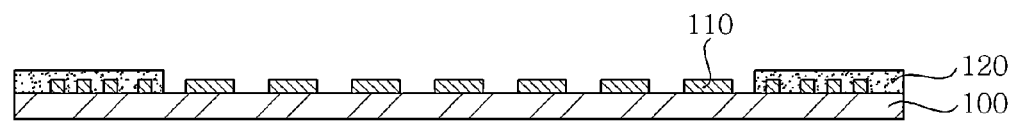
FIGS. 2A to 2F are cross-sectional views sequentially showing the process of a packaging method of a package according to a preferred embodiment of the present invention.

With the packaging method of the package according to the preferred embodiment of the present invention, a plurality of pads 110 and SR patterns 120 burying other circuit patterns are first formed on a substrate 100, as shown in FIG. 2A.

Specifically, in order to form the plurality of pads 110 and another circuit patterns on the substrate 110, a first dry film pattern having openings corresponding to the pad 110 and another circuit pattern is formed.

Next, the first dry film pattern may be filled with copper by methods, for example, a chemical vapor deposition (CVD) method, a physical vapor deposition (PVD) method, a subtractive method, an additive method using an electroless copper plating or electrolytic copper plating, a semi-additive process (SAP), and a modified semi-additive process (MSAP).

As such, the first dry film pattern is filled with the copper and then the dry film pattern is delaminated, such that the plurality of pads 110 and another circuit pattern are formed, as shown in FIG. 2A.

Subsequently, the SR pattern 120 burying another circuit pattern formed in the region except for the pad 110 region using the solder resist is formed.

Figure 2B:
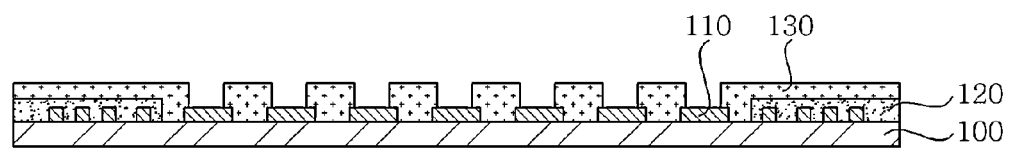

After the plurality of pads 110 and the SR pattern 120 burying another circuit pattern are formed on the substrate 100, a second dry film pattern 130 exposing each of the pads 110 is formed, as shown in FIG. 2B.

Specifically, the second dry film pattern first laminates a dry film in an uncured state on the substrate 100 on which the plurality of pads 110 and the SR pattern 120 are formed, using a laminate.

Next, the dry film laminated on the substrate 100 is subjected to a patterning process including a lithography process, an etching process, and the like, such that a second dry film pattern 130 having openings exposing each of the pads 110 may be formed.

Figure 2C:
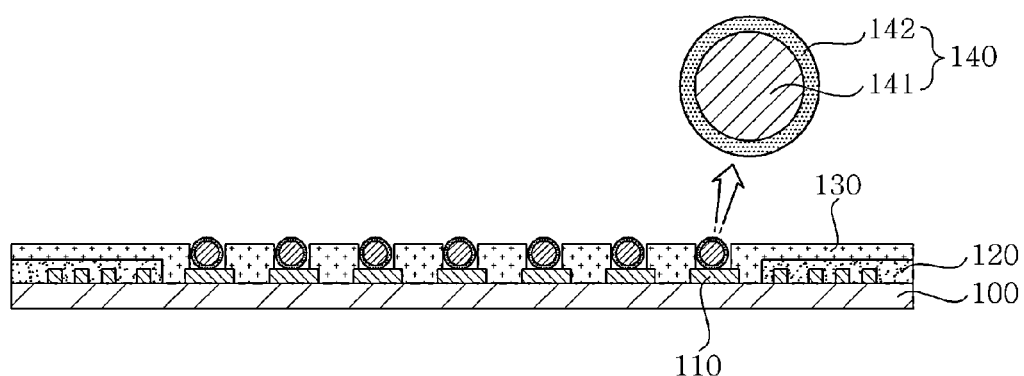

For the second dry film pattern 130 as described above, each of the openings exposing the pad 110 is mounted with a solder coating ball 140 having the same diameter, as shown in FIG. 2C.

Here, the solder coating ball 140 is formed of a metal ball 141 made of a conductive metal material and a solder coating film 142 formed on the outside of the metal ball 141. The metal ball 141 is made of a conductive metal material, for example, copper, gold, silver, aluminum, or the like, and the solder coating film 142 is formed by plating the metal ball 141 as described above with the solder by a method such as electroplating, or the like.

Figure 2D:
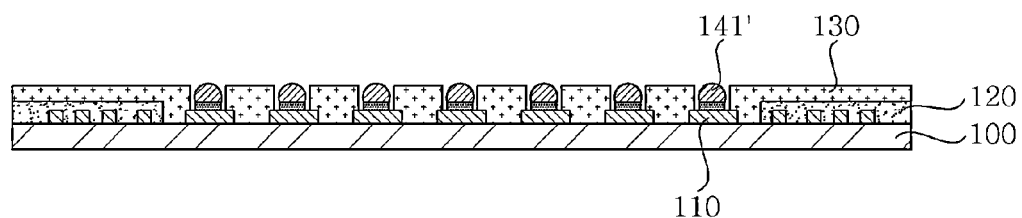

After the solder coating ball 140 is mounted, a reflow process is performed on the solder coating ball 140, such that the metal ball 141 of the solder coating ball 140 is modified to have the conductive metal pattern 141', as shown in FIG. 2D.

In this case, the solder coating film 142 formed on an outer surface of the metal ball 141 is melted and accumulated on a lower portion of the metal pattern 141' to thereby be adhered to the pad 110.

Figure 2E:
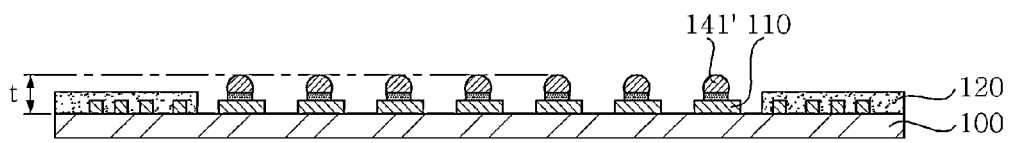

Next, when the second dry film pattern 130 is delaminated, a structure having the same height t from the upper surface of the substrate 100 to the metal pattern 141' is formed as shown in FIG. 2E.

Figure 2F:
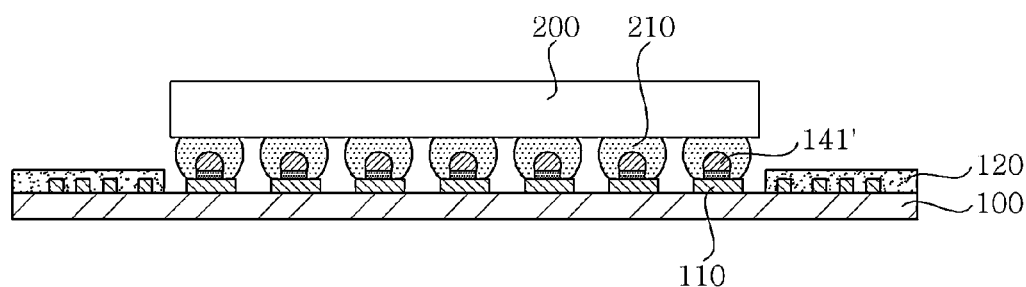

Next, the chip 200 is mounted on the metal pattern 141' having the same height t from the upper surface of the substrate 100 using the solder, as shown in FIG. 2F.

Therefore, a solder pattern 210 that the conductive metal pattern 141' is included in the solder is formed and the plurality of solder patterns 210 as described above are formed between the pad 110 on the substrate 100 and the chip 200 to electrically connect therebetween.

Since the solder pattern 210 as described above has the same volume and is formed between the pad 110 and the chip 200, the chip 200 is packaged while having the same mounted height T from the upper surface of the substrate 100.

Therefore, according to the packaging method of the package according to the preferred embodiment of the present invention, the solder pattern 210 is easily formed using the solder coating ball 140, thereby making it possible to reduce the manufacturing cost.

In addition, according to the packaging method of the package according to the preferred embodiments of the present invention, the chip 200 is packaged while having the same mounted height (T) from the upper surface of the substrate 100, thereby making it possible to improve the connection reliability between the chip 200 and the pad 110.

Figure 3:
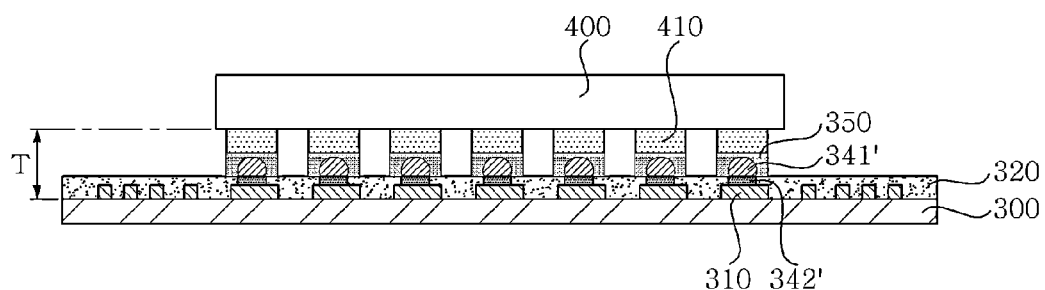
FIG. 3 is a cross-sectional view showing a package according to another preferred embodiment of the present invention.

Hereinafter, a package according to another embodiment of the present invention will be described with reference to FIG. 3. FIG. 3 is a cross-sectional view showing a package according to another preferred embodiment of the present invention.

As shown in FIG. 3, a package according to another preferred embodiment of the present invention includes a plurality of pads 310 formed on a substrate 300, a solder resist (SR) pattern layer 320 enclosing each of the pads 310 and a solder region thereon and burying another circuit pattern on the substrate 300, solder patterns 350 including a conductive metal pattern 341' on an upper surface of the SR pattern layer 320 and connected to a post bump 410, and a chip 400 connected to the pad 310 on the substrate 300 through the solder pattern 350 and the post bump 410 to be mounted thereon.

The SR pattern 320 encloses a region including each of the pads 310 and a solder of a top portion of the pad 310 on the substrate 300 using a solder resist and buries a plurality of circuits formed in another region.

The solder pattern 350 in which a conductive metal pattern 341' is included in the solder, electrically connects between the post bump 410 of the chip 400 and the pad 310, while having a form in which the conductive metal pattern 341' connected to the solder of the top portion of the pad 310 is included in an upper solder.

Specifically, the conductive metal pattern 341', which is formed to support the form of the solder pattern 350, is formed of a pattern in which a ball shape made of metal materials, for example, copper, gold, silver, aluminum, or the like, is modified in a reflow process.

Since each of the solder patterns 350 as described above has the same volume and is connected to the post bump 410, the chip 400 is packaged while having the same mounted height T from an upper surface of the SR pattern layer 320.

Therefore, according to the package according to another preferred embodiment of the present invention, the chip 400 is packaged while having the same mounted height (T) from the upper surface of the SR pattern layer 320, thereby making it possible to improve connection reliability between the chip 400 and the pad 310.

Hereinafter, a packaging method of a package according to another preferred embodiment of the present invention will be described with reference to FIGS. 4A to 4G. FIGS. 4A to 4G are cross-sectional views sequentially showing the process of a packaging method of a package according to another preferred embodiment of the present invention.

Figure 4A:
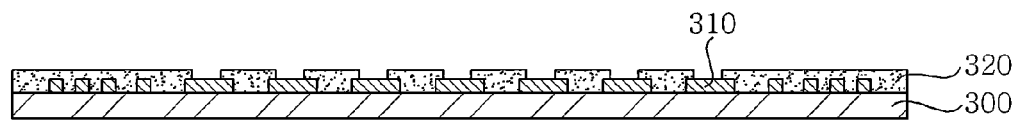
FIGS. 4A to 4G are cross-sectional views sequentially showing the process of a packaging method of a package according to another preferred embodiment of the present invention.

With the packaging method of the package according to another preferred embodiment of the present invention, the SR pattern layer 320 exposing upper surfaces of a plurality of pads 310 and burying other circuit patterns is formed on a substrate 300, as shown in FIG. 4A.

Specifically, in order to form the plurality of pads 310 and another circuit patterns on the substrate 310, a first dry film pattern having openings corresponding to the pad 310 and another circuit pattern is formed on an upper surface of the substrate 300.

Next, the first dry film pattern may be filled with copper by methods, for example, a chemical vapor deposition (CVD) method, a physical vapor deposition (PVD) method, a subtractive method, a additive method using an electroless copper plating or electrolytic copper plating, a semi-additive process (SAP), and a modified semi-additive process (MSAP).

As such, the first dry film pattern is filled with the copper and then is delaminated, such that the plurality of pads 310 and another circuit pattern are formed on the substrate 300, as shown in FIG. 4A.

The SR pattern layer 320 exposing the upper surface of the pad 310 and burying another circuit pattern may be formed by applying a solder resist to the substrate 300 including the plurality of pads 310 and another circuit pattern as described above and performing a patterning process including a lithography process and an etching processes on the applied solder resist.

Figure 4B:
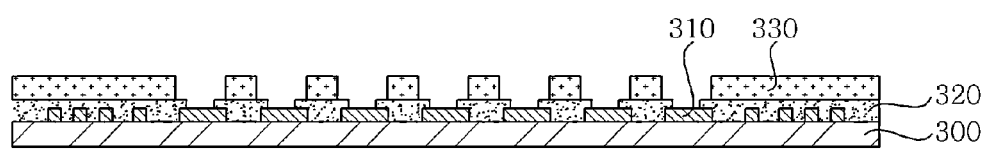

After the SR pattern layer 320 is formed, a second dry film pattern 330 exposing each of the upper surfaces of the pad 310 is formed on an upper surface of the SR pattern layer 320, as shown in FIG. 4B.

Specifically, for the second dry film pattern, a dry film in an uncured state is first laminated on the SR pattern 320 using a laminate.

Next, the laminated dry film is subjected to a patterning process including a lithography process, an etching process, a cleaning process, and the like, such that the second dry film pattern 330 having openings exposing the upper surface of each of the pads 310 may be formed.

Figure 4C:
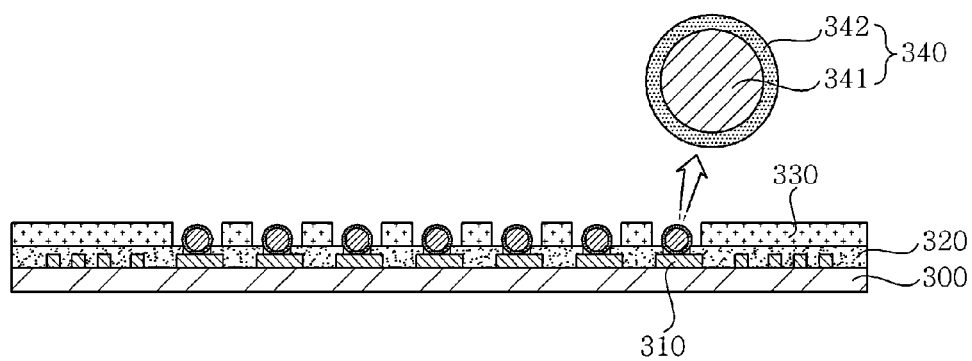

For the second dry film pattern 330 as described above, each of the openings exposing the upper surface of the pad 310 is mounted with a solder coating ball 340 having the same diameter, as shown in FIG. 4C.

The solder coating ball 340 is formed of a metal ball 341 made of a conductive metal material and a solder coating film 342 formed on the outside of the metal ball 341. The metal ball 341 is made of the conductive metal material, for example, copper, gold, silver, aluminum, or the like, and the solder coating film 342 is formed by plating the metal ball 341 with the solder by a method such as electroplating, or the like.

Figure 4D:
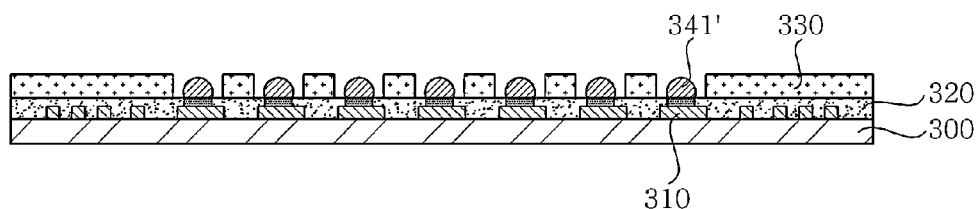
Figure 4E:
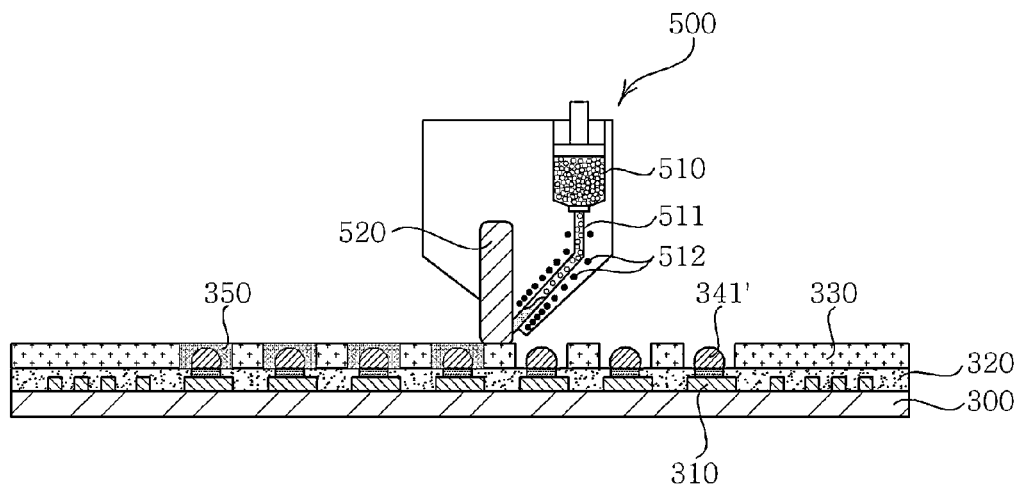

After the solder coating ball 340 is mounted, a reflow process is performed on the solder coating ball 340, such that the metal ball 340 of the solder coating ball 341 is modified to have the conductive metal pattern 341', as shown in FIG. 4D.

In this case, the solder coating film 342 formed on an outer surface of the metal ball 341 is melted and accumulated on a lower portion of the metal pattern 341' as the solder to thereby be adhered to the pad 310.

Next, the solder is injected into the openings of the second dry film pattern 330 each provided with the metal pattern 341' using a solder injector 500.

As such, as the solder is injected into the openings using the solder injector 500, a solder pattern 350 in which the metal pattern 341' is buried by the solder may be formed.

Here, the solder injector 500 includes a storing part 510 storing the solder supplied from the outside, a discharging hole 511 connected to the storing part 510 in the form of a pipe to discharge the solder, a heating part 512 enclosing and heating the discharging hole 511, and a press-fitting part 520 allowing a melted solder discharged from the discharging hole 511 to flow a surface to be injected.

The storing part 510 stores the solder supplied from the outside and includes a pressurization pump or a piston, thereby discharging the solder into the discharging hole 511. Here, the storing part 510 is supplied with the solder in the form of a solder paste and stores a flux or the like in addition to the solder, thereby discharging them into the discharging hole 511.

The heating part 512 is formed of a heat wire or a heater enclosing a circumference of the discharging hole 511, and heats and melts the solder discharged along with the discharging hole 511.

The press-fitting part 520 is a part contacting and squeegeeing the upper surface of the second dry film pattern 330 and the melted solder discharged from an end of the discharging hole 511 flows down along with a surface of the press-fitting part 520. The press-fitting part 520 is formed of an elastic material, such that the melted solder discharged from the end of the discharging hole 511 flows to be filled and press-fitted in the openings of the second dry film pattern 330.

Due to the press-fitting part 520, the solder pattern 350 in which the metal pattern 341' is buried may be formed to have a flat upper surface.

Figure 4F:
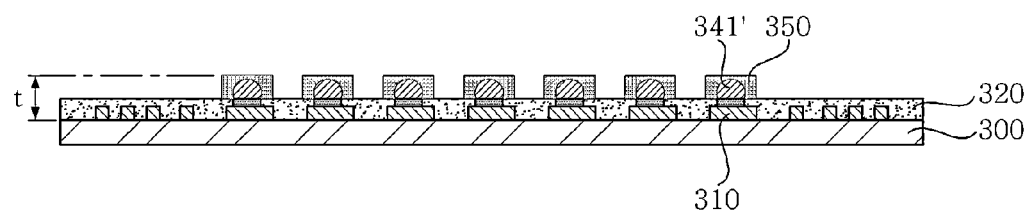
Figure 4G:
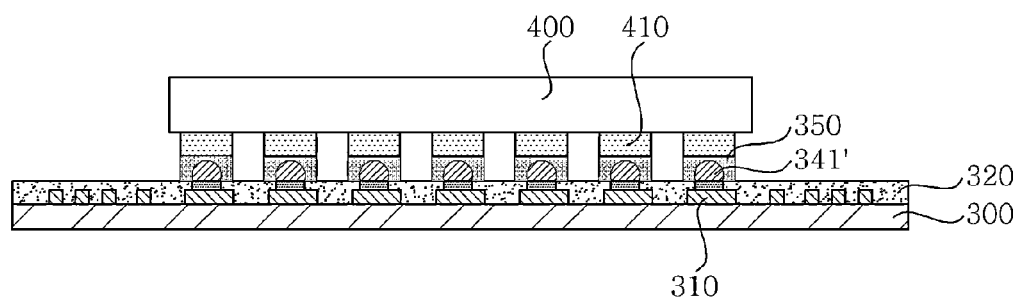

Next, when the solder pattern 350 is cured and then the second dry film pattern 330 is delaminated, the solder pattern 350 having the same height t from the upper surface of the substrate 300 is formed as shown in FIG. 4F.

The solder pattern 350 is connected to a post bump 410, such that a chip 400 is mounted so as to be electrically connected to the pad 310 on the substrate 300. Of course, the chip 400 may also be mounted to be electrically connected to the pad 310 on the substrate 300 only using the solder pattern 350, without the post bump 410.

Therefore, the chip 400 is packaged while having the same mounted height from the upper surface of the SR pattern layer 320, thereby making it possible to improve connection reliability between the chip 400 and the pad 310.

According to the package according to the preferred embodiment of the present invention, the chip is packaged while having the same mounted height (T) from the upper surface of the substrate, thereby making it possible to improve the connection reliability between the chip and the pad.

According to the packaging method according to another preferred embodiment of the present invention, the solder pattern is easily formed using the solder coating ball, thereby making it possible to reduce the manufacturing cost.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A package comprising:
   a plurality of pads formed on a surface of a substrate;
   a solder resist (SR) pattern enclosing a region of the pad and burying another circuit pattern;
   a solder pattern including a metal pattern therein using a solder and formed on an upper surface of each of the pads; and
   a chip mounted on the substrate through the solder pattern, wherein the solder of the solder pattern is formed to enclose the metal pattern.

2. The package as set forth in claim 1, wherein the solder pattern includes a metal pattern made of a conductive metal material in the solder.

3. The package as set forth in claim 1, wherein the chip is formed at the same height from an upper surface of the substrate.

4. The package as set forth in claim 1, further comprising a post bump between the chip and the solder pattern.

* * * * *